United States Patent [19]

Sakai et al.

[11] Patent Number: 5,447,267
[45] Date of Patent: Sep. 5, 1995

[54] METHOD OF SOLDERING ELECTRONIC PART USING A BOND FOR TACKING THE ELECTRONIC PART

[75] Inventors: Tadahiko Sakai, Fukuoka; Shinichi Kuroki, Kagoshima, both of Japan

[73] Assignee: Matsushita Electric Industrial Co., Ltd., Osaka, Japan

[21] Appl. No.: 190,605

[22] Filed: Feb. 2, 1994

[30] Foreign Application Priority Data

Feb. 8, 1993 [JP] Japan .................. 5-019805

[51] Int. Cl.⁶ .................. B23K 31/02; H05K 3/34
[52] U.S. Cl. .................. 228/175
[58] Field of Search .............. 228/175, 180.1, 180.21, 228/180.22

[56] References Cited

U.S. PATENT DOCUMENTS

| | | | |
|---|---|---|---|
| 4,172,547 | 10/1979 | DelGrande | 228/175 |
| 4,208,005 | 6/1980 | Nate et al. | 228/175 |
| 4,312,692 | 1/1982 | Ikeda et al. | 156/272 |
| 4,345,371 | 8/1982 | Ohsawa et al. | 228/175 |
| 4,398,660 | 8/1983 | Pampalone et al. | 228/175 |
| 4,578,426 | 3/1986 | Santorelli | 525/109 |
| 4,595,606 | 6/1986 | St. John et al. | 427/96 |
| 5,102,030 | 4/1992 | Tamashima et al. | 228/175 |
| 5,254,412 | 10/1993 | Fujimoto | 428/473.5 |

*Primary Examiner*—Mark Rosenbaum
*Assistant Examiner*—Jeanne M. Elpel
*Attorney, Agent, or Firm*—Stevens, Davis, Miller & Mosher

[57] ABSTRACT

An electronic part is tacked to a circuit board, leads of the electronic part being made into contact with cream solder built up on the circuit board, and thereafter, the circuit board is heated up so as to melt the cream solder in order to solder the electronic part to the circuit board. In this procedure, the melting temperature of a hardener in the tacking bond, that is, the hardening temperature of the tacking bond, is higher than that of the cream solder, thereby making it possible to prevent hindrance to sinking of the lead terminal of the electronic part into the melted cream solder.

1 Claim, 5 Drawing Sheets

METHOD OF SOLDERING ELECTRONIC PART USING A BOND FOR TACKING THE ELECTRONIC PART

BACKGROUND OF THE INVENTION

The present invention relates to a bond for tacking an electronic part on a circuit board during soldering of the electronic part on the circuit board, and also relates to a method of soldering an electronic part with the use of such a bond.

During recent years, the technology of soldering a surface-mounting type electronic part onto a board, on which a circuit pattern is formed, has been widely used. Further, a method of soldering surface-mounting type electronic parts on opposite surfaces of a circuit board, that is, the so-called double-sided mounting method, has been prosperously used. In the case of the double-sided mounting method, soldering parts are at first formed on electrodes on the first surface (upper surface) of the circuit board, then an electronic part is mounted, its being landed on the soldering parts, and thereafter, the circuit board is heated in its entirety up to a temperature which is higher than the melting point of the soldering parts so as to melt the soldering parts in order to solder the electronic part to the first surface of the circuit board. Next, the circuit board is turned over so that the second surface thereof is faced up, and then the soldering is performed on the second surface with the use of the same process as mentioned above. In this case, there is a possibility of such a problem that the soldering part on the first surface is again melted during the second heating of the circuit board, resulting in that the electronic part on the first surface of the circuit board drops by its dead weight or vibration. In order to eliminate the above-mentioned problem, the electronic part on the first part is usually tacked on the first surface of the circuit boar by a tacking bond.

Explanation will be hereinbelow made of a conventional method of a soldering electronic part on the first surface of a circuit board with the use of a tacking bond, with reference to FIGS. 10 and 11.

Cream solder 103 is printed on the upper surfaces of electrodes 102, 102 on the circuit board 101 by using a screen printing machine. This cream solder is a mixture of solder particles having a granular size of about several ten microns, and flux, and it reduces its apparent bulk when it is melted. Next, a tacking bond 104 is applied by means of a bond applying device on the upper surface of the circuit board 101 on which the body 106 of an electronic part 105 is to be located, and then the electronic part 105 is mounted on the circuit board 101 by means of a chip mounter. With this arrangement, the body 106 of the electronic part 105 is landed on the tacking bond 104 while leads 107 horizontally extending from the body 106 are landed on the cream solder 103. Thereafter, the circuit board 101 is introduced into a heating furnace for heating the circuit board 101 so as to melt the cream solder 103. The melting point of the cream solder which is generally available is about 183 deg. C. Accordingly, the circuit board is heated up to a temperature (about 220 deg. C.) above the melting point.

By the way, the conventional tacking bond 104 is in general a mixture of synthetic resin such as epoxy resin and a hardener such as 2-methyl imidazole. The melting point of 2-methyl imidazole is about 140 deg. C. which is the hardener temperature of the conventional tacking bond 104 and which is relatively lower than the melting point (about 183 deg. C. as mentioned above) of the cream solder 103. Accordingly, if the circuit board is heated up in the heating furnace, the cream solder 103 is melted after the tacking bond 104 is hardened. Thus, the tacking bond which becomes early harder inhibits the leads of the electronic part from sinking into the melted cream solder due to its dead weight or the surface tension of the melted solder. As a result, as shown in FIG. 11, a problem occurs such that the leads 107 are not surely connected to the electrodes 102 by the solder 103. Such a problem has occurred often particularly in such a case that an electronic part 5 having very thin leads 7 laid at fine pitches is soldered.

SUMMARY OF THE INVENTION

The present invention is devised in view of the above-mentioned problem inherent to the conventional soldering method for electronic parts, and accordingly, one object of the present invention is to provide a tacking bond with which leads of an electronic part can be surely soldered onto electrodes on a circuit board without inhibiting the leads of the electronic part from sinking into melted solder due to the dead weight of the electronic part or the surface tension of the melted solder.

According to the present invention, a bond for tacking an electronic part, is composed of synthetic resin and a hardener having a melting temperature which is higher than the melting point of solder, and mixed in the synthetic resin.

Further, according to a specific form of the present invention, a bond for tacking an electronic part, is composed of a hardener covered at its outer surface with thermoplastic synthetic resin having a melting temperature higher than the melting temperature of solder, which is mixed in synthetic resin.

Other and further objects, features and advantages of the present invention will be more apparent in detail from the following description with reference to the accompanying drawings in which:

DETAILED DESCRIPTION OF PREFERRED EMBODIMENTS OF THE INVENTION

Next explanation will be made of embodiments of the present invention with reference to the drawings:

(First Embodiment)

Figure 1:
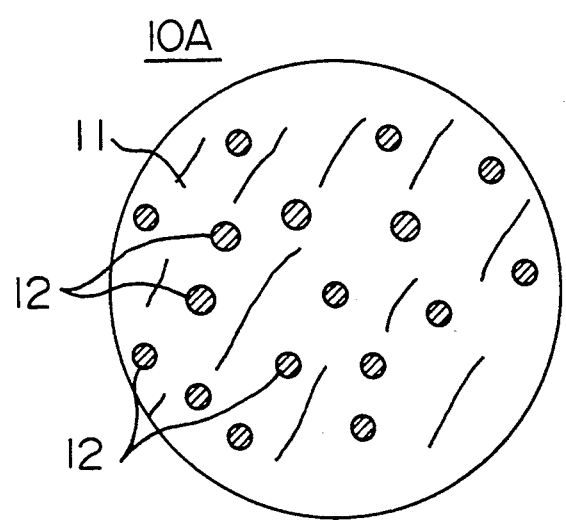
FIG. 1 is an enlarged view illustrating a bond for tacking an electronic part in a first embodiment of the present invention.

FIG. 1 shows an enlarged view illustrating a bond 10A for tacking an electronic part, in one embodiment of the present invention. The tacking bond 10A is composed of synthetic resin 11 such as epoxy resin, and particles of a hardener 12 mixed in the synthetic resin. As to the synthetic resin, for example, bisphenol A type epoxy resin, phenol novolac type epoxy resin, or polyphenol type epoxy resin is used. Further, as to the hardener, the following material is used:

|  | (melting temperature) |
|---|---|
| Isophthal acid hydrazide | (210 deg. C.) |
| 2,4-diamino-6-[2-undecylimidazolyl-(1)]-ethyl-S-triazine | (185 deg. C.) |
| Dicyano diamide | (210 deg. C.) |
| 2,4-diamino-6-[2-ethyl-4-methylimidazolyl-(1)]-ethyl-S-triazine | (220 deg. C.) |
| Diaminomaleonitrile | (185 deg. C.) |

Further, the blend ratio is indicated as follows:

| Epoxy resin | 100 weight parts |
|---|---|
| Hardener | 5 weight parts |

The melting temperature of solder is in general about 183 deg. C., and accordingly, the melting point of the hardener is 185 to 220 deg. C. which is higher than the melting temperature of the solder.

FIGS. 2, 3, 4 and 5 are views for explaining a method of soldering an electronic part according to the present invention.

Figure 2:
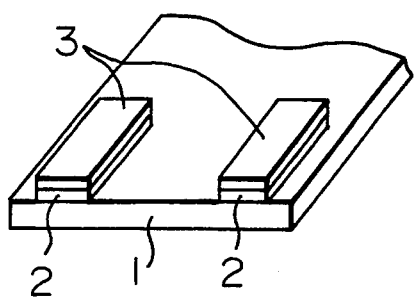
FIGS. 2 to 5 are views for explaining a method of soldering an electronic part, according to the present invention.

Referring to FIG. 2, cream solder 3 is applied on electrode parts 2 formed of a copper foil on the upper surface of a circuit board 1. The cream solder is composed of an aggregation of microparticles of solder, and is in general applied on the electrodes 2 by means of a screen printing device. It is noted that solder precoat which is formed by a plating process or a leveller process, or the like can be used as solder, other than the cream solder 3.

Figure 3:
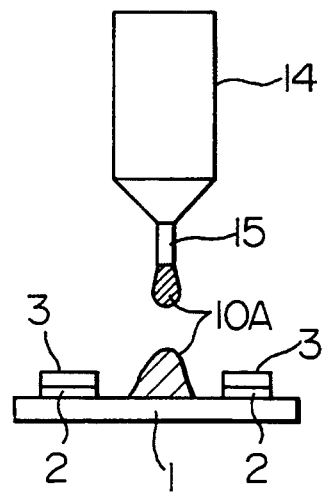
Figure 4:
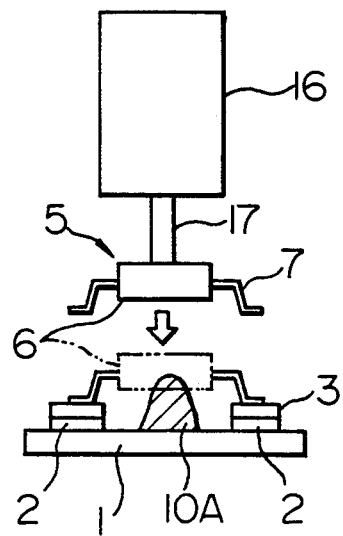

Next, as shown in FIG. 3, a tacking bond 10A is dispensed onto the upper surface of the circuit board 1 from a nozzle 15 of a dispenser 14 as a bond applying device. Then, as shown in FIG. 4, an electronic part 5 is sucked up by a nozzle 17 on a carrier head 16 of a chip mounter under vacuum, and then the electronic part 5 is mounted on the circuit board 1 after leads 7 extending from opposite side surfaces of the body 6 of the electronic part 5 are aligned with the cream solder 3 on the circuit board 1. In this embodiment, the body 6 of the electronic part 5 incorporating the leads 7 is landed on the tacking bond while the leads are landed on the cream solder 3 for mounting the electronic part 5. It is noted that this embodiment can be applied to any kind of surface-mounting type electronic parts including connectors.

Figure 5:
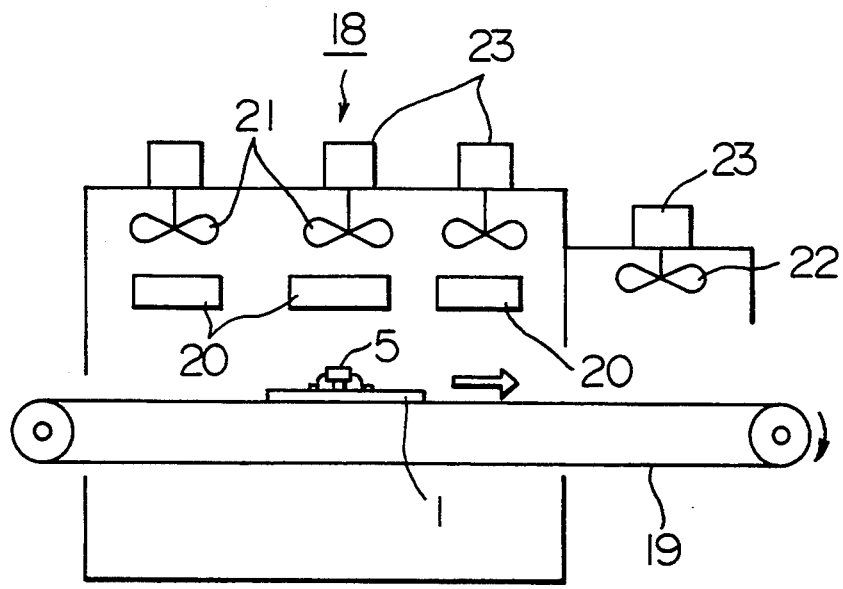

Then, as shown in FIG. 5, this circuit board is led into a heating furnace 18 in which air that is heated by heaters 20 incorporated in the heating furnace 18 is blown onto the circuit board 1 by fans 21 while the circuit board is conveyed by a conveyer 19 through the furnace 18, and accordingly, the circuit board 1 is heated up to the melting temperature (in general 183 deg. C.) of the cream solder. Then, the leads 7 sink into the melted cream solder 3 due to the dead weight of the electronic part 5 and the surface tension of the melted solder.

Figure 6:
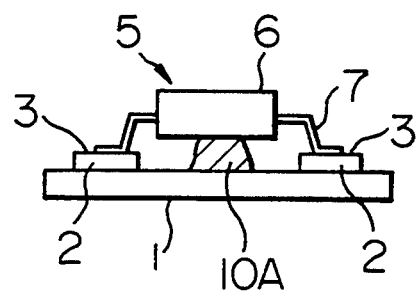
FIG. 6 is a side view illustrating an electronic part and a circuit board on which the electronic part is soldered.
Figure 7:
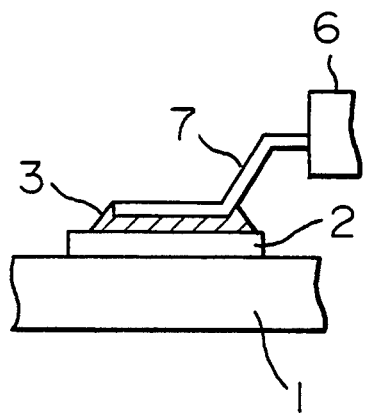
FIG. 7 is an enlarged view illustrating a part of the circuit board around leads of an electronic part which are soldered with the use of the bond for tacking the electronic part, according to the present invention.

Further, when the temperature of the circuit board 1 rises up to a temperature higher than 183 deg. C., the hardener 12 in the tacking bond 10A is melted, and then, the melted hardener 12 is eluted into the synthetic resin 11 so that the tacking bond 10A is gradually hardened. That is, the heating in the furnace 8 is still continued until the tacking bond 10A is initially hardened after the solder 3 is melted. Thereafter, the circuit board 1 is led out from the heating furnace 18, and is then cooled by cooling fans 22, and then the melted cream solder 3 is solidified so that the leads 7 are fixed to the electrode parts 2. It is noted that the fans 21, 22 are driven by motors 23. FIG. 6 shows the circuit board 1 after the soldering has been completed. Further, FIG. 7 is an enlarged view which shows the soldered part in the distal end part of one of the leads 7. As shown, the lead 7 is sufficiently sunk into the solder and it is surely soldered to the electrode part 2.

Thus, the tacking bond 10A is hardened after the cream solder 3 is melted, and accordingly, the leads 7 are firmly soldered to the electrode parts 2 without hindering the electronic part 5 from sinking. Table 1 shows the comparison between reference examples of in this embodiment of the present invention and a conventional example.

Referring to Table 1, bisphenol A-type epoxy resin is used as the synthetic resin 11 in all examples. The hardener 12 in a reference example 1 is isophthal acid hydrazide (melting temperature of 210 deg. C.), and the hardener 12 in a reference example 2 is 2,4-diamino-6-[2-undecylimidazolyl-(1)]-ethyl-S-triazine (melting temperature of 185 deg. C.) while the hardener in the conventional example is 2-methylimidazole (melting temperature of 150 de. C.). Further, the reflow temperature (a temperature for melting the cream solder 3) in the furnace is 230 deg. C., and the reflow temperature time is 30 sec.

As given by the bonding strength in table 1, the conventional tacking bond is hardened at 150 deg. C. so as to exhibit a strength higher than 2 kgf which hinders the electronic part 5 from sinking. The oven defective rate of the soldering using the conventional tacking bond is 35%. On the contrary, in the reference example 1, the bonding strength is higher than 0.5 kgf at 210 deg. C. and 2 kgf at 230 deg. C. Further, in the reference example 2, the bonding strength is higher than 2 kgf at 210 deg. C. The tacking bond 10A in the reference examples 1 and 2 according to the present invention does not have a high strength until the temperature rises up to 210 deg. C. or 230 deg. C., and accordingly, it does not hinder the electronic part 5 from sinking into the melted cream solder 3, and accordingly, the oven defective rate is 0%. It is noted that the bonding strength was obtained by using a small capacitor having a longitudinal length of 1.6 mm and a crosswise length of 0.8 mm, and a glass epoxy resin substrate was used as the circuit board so as to measure the shear strength. Further, the oven defective rate was obtained from the following formula with the use of an electronic part having 100 leads laid at 0.5 mm pitches on the glass epoxy resin substrate.

Oven Defective Rate (%) = {(Number of Electronic Parts having more than 1 Leads with Oven Defect)/(Number of Electronic -continued Parts to be tested)} × 100

Figure 8:
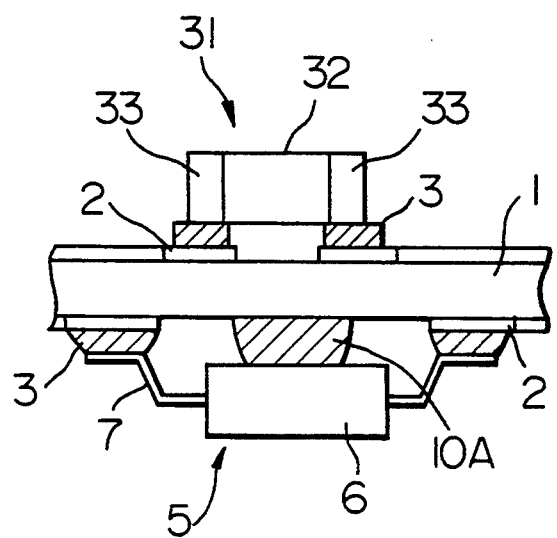
FIG. 8 is a view for explaining a double sided mounting method according to the present invention.

Referring to FIG. 8 is which is a sectional view that shows a double-sided mounting type circuit board during heating in the furnace, the circuit board 1 has been turned over, and the above-mentioned electronic part 5 has been soldered on the lower surface of the circuit board 1. An electronic part 31 is mounted on the upper surface of the circuit board 1 through a later process. This electronic part 31 is a capacitor chip having electrodes 33 on opposite sides of the body 32 thereof, these electrodes 33 are soldered to electrode parts 2 on the circuit board 1 by means of the cream solder 3. The circuit board 1 is heated again up to a temperature higher than 183 deg. C. for soldering. However, the electronic part 5 at the lower surface of the circuit board 5 never drops since the tacking bond 10A is not melted even though it is reheated. Accordingly, the tacking bond 10A is effective in particular for a double sided mounting process of soldering electronic parts on both front and rear surfaces of the circuit board.

(Second Embodiment)

Figure 9:
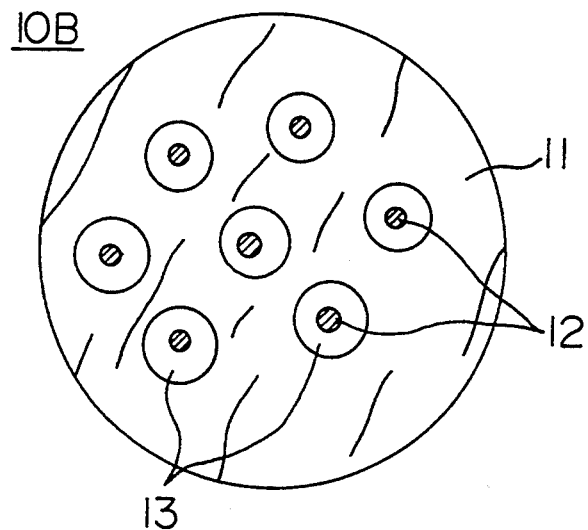
FIG. 9 is an enlarged view illustrating a bond for tacking an electronic part in a second embodiment of the present invention.
Figure 10:
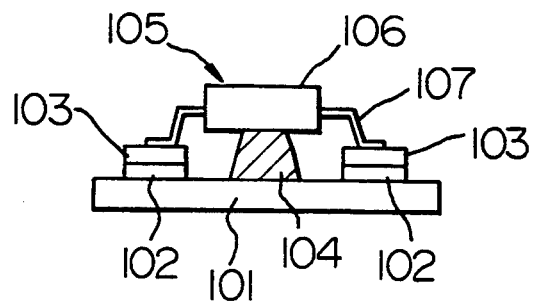
FIG. 10 is a view for explaining a soldering method using a conventional bond for tacking an electronic part.
Figure 11:
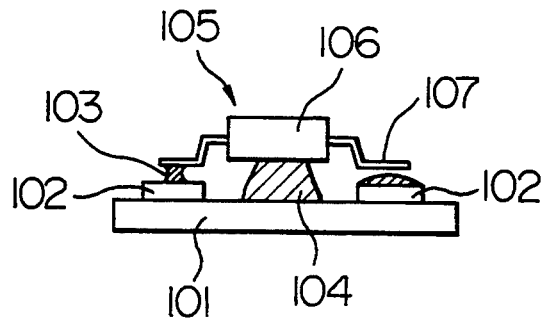
FIG. 11 is a side view illustrating an electronic part and a circuit board on which the electronic part is bonded.

Referring to FIG. 9 which is an enlarged view that shows a bond 10B for tacking an electronic part in a second embodiment, the tacking bond 10B is composed of synthetic resin 11 such as epoxy resin and particles of hardener 12 covered at its outer surface with thermoplastic resin 13 and mixed in the synthetic resin 11. The particle size of the thermoplastic resin is about 3 to 10 μm. For example, bisphenol type epoxy resin, phenol novolac type epoxy resin, or polyphenol type epoxy resin is used as the synthetic resin 11. Further, an amine group hardener such as polymethylene diamine or aromatic group amine, an imidazole group hardener such as methyl imidazole or phenyl imidazole is used as the hardener 12. Further, the thermoplastic resin 13 has a melting temperature of about 183 deg. C. to 230 deg. C. which is higher than the melting temperature (in general about 180 deg. C.). For example, polyphenyl sulphide, polyphenylene oxide, polyamide, polyimide, polyamide-imide, polysulphone, or polyether-etherketone is used as the thermoplastic resin 13.

A method of soldering an electronic part using the above-mentioned tacking bond 10B is similar to that of the first embodiment using the tacking bond 10A. That is, as shown in FIG. 3(a), the circuit board 1 on which an electronic part 5 has been mounted by using the tacking bond 10B is introduced into the heating furnace 18, and air which is heated by the heaters 20 incorporated in the furnace 18 is blown by the fans 21 onto the circuit board 1 while it is conveyed by the conveyer 19 through the heating furnace 18 so that the circuit board 1 is heated up to a temperature higher than the melting temperature (in general about 183 deg. C.) of the cream solder 3. Thus, the cream solder 3 is melted, and accordingly, the leads 7 sufficiently sink into the melted cream solder 3 due to the dead weight of the electronic part 5 and the surface tension of the melted solder.

Further, when the circuit board 1 is heated up to a temperature higher than 183 deg. C., the thermoplastic synthetic resin 13 in the tacking bond 10B is melted so that the hardener 12 is eluted into the synthetic resin 11, and accordingly, the tacking bond 13 is hardened, resulting in that the body 6 is fixed to the circuit board 1. Then, the circuit board 1 is delivered from the heating furnace 18 and is then cooled by the cooling fans 22 so that the cream solder 3 is solidified. Thus, the leads 7 are secured to the electrodes 2.

Even in this case, as shown in FIG. 7, the leads 7 sufficiently sink so as to be soldered to the electrode parts 2. Thus, the tacking bond 10B is hardened after the cream solder 3 is melted, and accordingly, the leads 7 can be firmly soldered to the electrode parts 2 without hindering the electronic part 5 from sinking. Table 2 shows the result of comparison between the second embodiment and a conventional tacking bond.

Referring to table 2, bisphenol A-type epoxy resin is used as the synthetic resin while 2-methyl imidazole is used as the hardener 12. The thermoplastic synthetic resin 13 in a reference example 1 is polyphenylene sulphide having a melting temperature of 220 deg. C., and the thermoplastic synthetic resin in a reference example 2 is polyether-etherkentone having a melting temperature of 190 deg. C. Further, the reflow temperature (temperature for melting the cream solder 3) in the heating furnace is 230 deg. C., and the reflow time is 30 sec.

As exhibited by the bonding strength in table 2, the conventional tacking bond is hardened at a temperature of 150 deg. C. so as to exhibit a high strength of higher than 2 kgf, hindering the electronic part 5 from sinking. The oven defective rate of soldering in use of the conventional tacking bond is 28%. On the contrary, in the reference examples 1 and 2, the tacking bond 10B is hardened so as to give a high bonding strength larger than 2 kgf at a temperature higher than 230 deg. C. or 210 deg, and accordingly, it does not hinder the electronic part 5 from sinking into the melted cream solder. Thus, the oven defective rate of soldering is 0%.

As mentioned above, with the use of the bond for tacking an electronic part, according to the present invention, when the circuit board is heated in the heating furnace for soldering the electronic part, the tacking bond is hardened after the solder is melted, and accordingly, the tacking bond does not hinder the electronic part from sinking due to the dead weight of the electronic part and the surface tension of the melted solder. Thus, the electrodes of the electronic part is surely soldered to the electrodes part on the circuit board.

TABLE 1

| | | Reference Example 1 | Reference Example 2 | Conventional Example |
|---|---|---|---|---|
| Blend | Epoxy Resin | Bisphenyl A-type Epoxy Resin | Bisphenyl A-type Epoxy Resin | Bisphenyl A-type Epoxy Resin |
| | Hardener | Isophthal acid hydrazide | 2,4-diamino-6[2-undecyl imidazolyl(1)]-ethyl-S-Triazine | 2-methyl imidazole |
| | Melting Point | 210 deg. C. | 185 Deg. C. | 140 deg. C. |
| Bonding Strength [kgf] | 150 deg. C. | 0 | 0 | more than 2 |
| | 170 deg. C. | 0 | 0 | more than 2 |
| | 190 deg. C. | 0 | 1 | more than 2 |
| | 210 deg. C. | 0.5 | more than 2 | more than 2 |
| | 230 deg. C. | more than 2 | more than 2 | more than 2 |
| Oven Defective | Reflow Temperature | 0 | 0 | 35 |

TABLE 1-continued

|  |  | Reference Example 1 | Reference Example 2 | Conventional Example |
|---|---|---|---|---|
| Rate | 230 deg. C. 30 sec |  |  |  |

TABLE 2

|  |  | Reference Example 1 | Reference Example 2 | Conventional Example |
|---|---|---|---|---|
| Blend | Expoxy Resin | Bisphenyl A-type Epoxy Resin | Bisphenyl A-type Epoxy Resin | Bisphenyl A-type Epoxy Resin |
|  | Hardener | 2-methyl imidazole | 2-methyl imidazole | 2-methyl imidazole |
|  | Thermoplastic Synthetic Resin (melting temperature) | Polyphenyl Sulphide (220 deg. C.) | Polyether-Etherketone (220 Deg. C.) |  |
| Bonding Strength [kgf] | 150 deg. C. | 0 | 0 | more than 2 |
|  | 170 deg. C. | 0 | 0 | more than 2 |
|  | 190 deg. C. | 0 | 1 | more than 2 |
|  | 210 deg. C. | 0.5 | more than 2 | more than 2 |
|  | 230 deg. C. | more than 2 | more than 2 | more than 2 |
| Oven Defective Rate (%) | Reflow Temperature 230 deg. C. 30 sec | 0 | 0 | 28 |

What is claimed is:

1. A method of soldering an electronic part comprising the steps of:

building up solder having a melting temperature, on an electrode part on a circuit board;

applying a tacking material having a hardening temperature higher than the melting temperature of said solder, on said circuit board;

landing an electrode of an electronic part having a body on said built-up solder, and also landing said body of said electronic part on said applied tacking material so as to mount said electronic part on said circuit board; and heating said circuit board until said built-up solder is melted so that the electrode of said electronic part sinks into said melted solder, and thereafter, said tacking material initiates hardening.

* * * * *